United States Patent
Gentner et al.

(10) Patent No.: US 7,109,526 B2
(45) Date of Patent: Sep. 19, 2006

(54) SEMICONDUCTOR OPTICAL DEVICE ON AN INDIUM PHOSPHIDE SUBSTRATE FOR LONG OPERATING WAVELENGTHS

(75) Inventors: Jean-Louis Gentner, Gif sur Yvette (FR); Francois Alexandre, Marcoussis (FR); Bruno Thedrez, Paris (FR); Olivier Gauthier-Lafaye, Marcoussis (FR)

(73) Assignee: Avonex Corporation, Fremont, CA (US)

( * ) Notice: Subject to any disclaimer, the term of this patent is extended or adjusted under 35 U.S.C. 154(b) by 43 days.

(21) Appl. No.: 10/893,140

(22) Filed: Jul. 15, 2004

(65) Prior Publication Data
US 2005/0056868 A1 Mar. 17, 2005

(30) Foreign Application Priority Data
Jul. 18, 2003 (FR) .................................. 03 08770

(51) Int. Cl.
*H01L 33/00* (2006.01)
(52) U.S. Cl. .............................. 257/94; 257/80; 257/96
(58) Field of Classification Search ................. 257/94; H01L 33/00
See application file for complete search history.

(56) References Cited

U.S. PATENT DOCUMENTS

| | | | |
|---|---|---|---|
| 5,282,211 A | | 1/1994 | Manlick et al. |
| 6,057,560 A | * | 5/2000 | Uchida ........................ 257/94 |
| 6,449,299 B1 | * | 9/2002 | Sato ........................ 372/45.01 |
| 2005/0040413 A1 | * | 2/2005 | Takahashi et al. ............ 257/96 |

OTHER PUBLICATIONS

Masahiko Knodow, Takeshi Kitatani, Shin Ichi Nakatsuka, Michael C. Larson, Kouji Nakahara, Yoshiaki Yazawa, Makoto Okai, and Kazuhisa Uomi, "GaInNAs: A Novel Material For Long-Wavelength Semiconductor Lasers," Quantum Electronics, vol. 3. No. 3, Jun. 1997, pp. 719-729.

M. Kondow, K. Uomi, A Niwa, T. Kitatani, S Watahiki, and Y. Yazawa, "A Novel Material of GaInNAs For Long-Wavelength-Range Laser Diodes With Excellent High-Temperature Performance," 2419A International Conference On Solid State Devices & Materials, Aug. 21-Aug. 24, 1995, Yokohama, JP Aug. 21, 1995, Tokyo, JP, pp. 1016-1018.

French Search Report, Application No. 0308770, dated Jun. 16, 2004.

* cited by examiner

*Primary Examiner*—David Nelms
*Assistant Examiner*—Dao H. Nguyen
(74) *Attorney, Agent, or Firm*—Patterson & Sheridan, LLP

(57) ABSTRACT

A semiconductor optical device such as a laser or semiconductor optical amplifier (SOA) based on an indium phosphide substrate or equivalent buffer layer. The active layer of the device is based on conventional InGaAs(P) alloy, but additionally includes N in order to increase the operating wavelength to greater than 1.5 μm, preferably to a wavelength lying in the C- or L-band. The active layer composition may thus be denoted $In_{1-x}Ga_xAs_yN_zP_p$ with $x \geq 0.48$, $y \leq 1-z-p$, $z \leq 0.05$, $p \geq 0$. The active layer may include a quantum well or multi-quantum wells in which case its thickness is preferably less than the critical thickness for lattice relaxation. In other embodiments the active layer is a "massive" layer with quasi-bulk properties. The active layer may advantageously be under tensile stress, preferably roughly between 1% and 2.2%, to manipulate the light and heavy hole bands. The active layer is typically bounded by barrier layers made of a suitable semiconductor alloy, such as AlInAs or InGaAs(P).

19 Claims, 2 Drawing Sheets

FIG_1
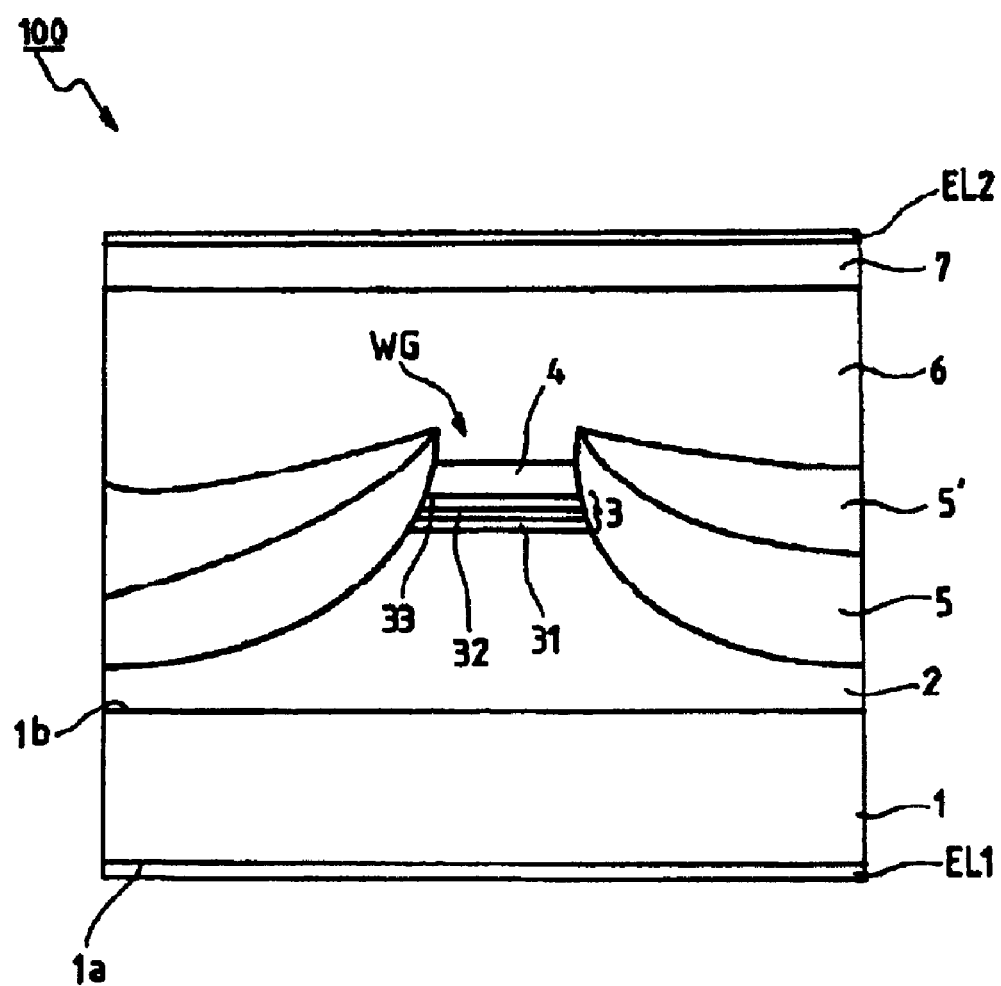

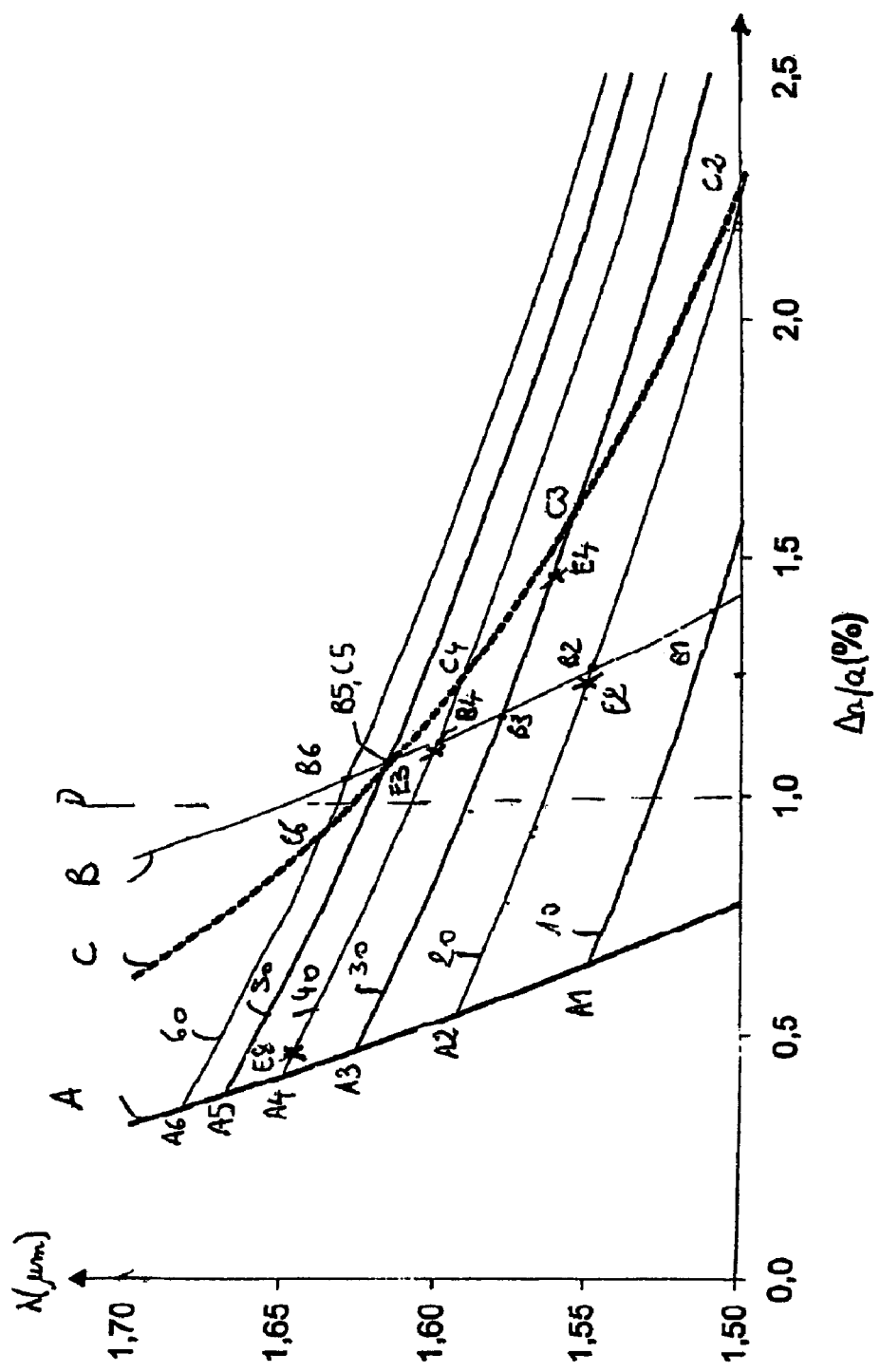
FIG_2

SEMICONDUCTOR OPTICAL DEVICE ON AN INDIUM PHOSPHIDE SUBSTRATE FOR LONG OPERATING WAVELENGTHS

CROSS-REFERENCE TO RELATED APPLICATIONS

This application claims benefit of French Patent Application No. 03 08 770, filed Jul. 18, 2003, which is herein incorporated by reference.

BACKGROUND OF THE INVENTION

1. Field of the Invention

The present invention relates to an optical semiconductor device that has a long operating wavelength and comprises an indium phosphide substrate.

2. Description of the Related Art

As is well known, lasers operating at long wavelengths, i.e. above 1.5 µm, are intended to be used for optical data transmission in the so-called C band (1530–1570 nm) and/or the so-called L band (1570–1610 nm).

These lasers have a vertical structure formed from a stack of semiconductor layers on a semiconductor substrate. In this stack there is an active layer, conventionally with single or multiple quantum wells separated by barrier layers, and interposed between two optical confinement layers.

The document with the title "Leading-edge optoelectronic device production using two-inch technology" Simes, R.; Capella, R. M.; Fernier, B.; Mayer, H. P.; in Conference Proceedings of 7th International Conference on indium phosphide and related materials, 9–13 May 1995, pages 10–13 thus discloses a direct-modulation laser operating at 1.55 µm and at 2.5 Gbit/s, constructed on a substrate of indium phosphide InP. The quantum-well layer is an alloy $In_{0.8}Ga_{0.2}As_{0.77}P_{0.23}$.

This type of laser is not suitable for high-temperature operation without thermal regulation. For example, for a temperature of 85° C., the characteristic temperature $T_0$ referred to the threshold current Is, which is defined by the relation $Is_{85°C.}=Is_{25°C.}\cdot e^{\Delta T/T_0}$ is limited to about 45° K. And the characteristic temperature $T_1$ referred to the differential efficiency η, which is defined by the relation $\eta_{85°C.}=\eta_{25°C.}\cdot e^{-\Delta T/T_1}$, remains below 130° K.

The aim of the invention is to provide a semiconductor optical device (continuous or direct-modulation laser, continuous laser combined with an electro-absorption modulator, semiconductor optical amplifiers, etc.) whose operating wavelength is within the C band or even the L band (bands possibly broadened) and which displays thermal and/or optoelectronic performance that is optimized in particular with respect to the temperature behaviour of the characteristics and/or the power emitted and/or if applicable the high-rate modulation behaviour.

SUMMARY OF THE INVENTION

For this purpose, the invention proposes a semiconductor optical device comprising:
- a substrate or equivalent buffer layer based on indium phosphide or another semiconductor with an approximate lattice match to indium phosphide,
- an active layer having a composition adjusted to an operating wavelength above 1.5 µm and that contains a gallium concentration x, an indium concentration 1−x and an arsenic concentration y characterized in that the concentration x is greater than or equal to 0.48, in that the composition further comprises a nitrogen concentration z less than or equal to 0.05 and in that the concentration y is roughly equal to 1−z.

The composition of the active layer can then be denoted In1−xGaxAsyNz in conventional notation if the active layer does not comprise additional alloy components.

The indium concentration 1−x has been lowered relative to that of the prior art in order to decrease the lattice parameter of the quantum-well layer and obtain a state of stress in tension (lattice parameter of the layer less than the lattice parameter of the substrate).

The nitrogen helps to reduce the energy of the band gap imposed by the state of stress in tension, which makes it possible to obtain the desired operating wavelength, in the C or L band, in contrast to the prior art, represented by the InGa(Al)AsP family of materials, which does not provide these useful wavelengths.

Nitrogen modifies the properties of electronic confinement of an active layer when the latter has quantum well(s), for example in lasers and certain semiconductor optical amplifiers (SOAs). More precisely, the energy Ec1 of the edge of the conduction band is reduced and the band offset between the quantum-well layer and the barrier layers is increased. Thus, the electronic confinement is strengthened and the device is less sensitive to thermal agitation and hence to a temperature rise. The thermal performance is improved in consequence: $T_0$ and $T_1$, will increase significantly.

Moreover, nitrogen is added in an amount that is small enough so as not to degrade the layer but nevertheless sufficient to adjust the lattice parameter to a desired value less than the lattice parameter of indium phosphide InP to obtain a stress state in tension.

The tensile stresses can be of a sufficient level to lift the degeneracy of the valence band in the case of a massive active layer. In the case of an active layer with quantum wells, the lh band (lh: light hole) crosses the hh band (hh: heavy hole) at a certain stress value, then goes above that band.

The crossing of the light-hole and heavy-hole bands is advantageous as it lowers the effective mass of the holes $m_h$ while promoting the emission of a transverse-magnetic (TM) polarized wave. An advantageous application of operation in TM mode is obtained in the case of integration of a laser with an optical isolator in monolithic technology.

Furthermore, nitrogen causes the effective electron mass $m_e$ to increase.

The increase in $m_e$ and decrease in $m_h$ lead to "symmetrization" of the structure of the bands, favouring transitions between the conduction band and the light-hole band.

In this configuration, fewer injected carriers are required to obtain the same optical gain G. Moreover, the gain G is proportional to the reduced mass $m_r$ defined by the relation $m_r=m_e\cdot m_h/(m_e+m_h)$, which is maximum when $m_e$ and $m_h$ are equal. As a result the differential gain and hence the external efficiency increase.

The device is more efficient in its conversion of the injected electrical energy into luminous flux.

For a given optical power output, it is necessary to inject fewer carriers than in the prior art. The control electronics can also be simplified, and power consumption is minimized. It also becomes possible to obtain an optical power output that is high enough for transmission over medium or long distances.

Furthermore, an increase in differential gain is accompanied by an inversely-proportional reduction in the Henry factor α. Thus, for lasers, faster modulations, typically starting from 10 Gbit/s, can be envisaged.

For the particular case of SOAs with a "massive" active layer of InGaAs in the prior art, the same limit exists when it is a question of covering the end of the C band and even more so the L band. Thus, the invention makes it possible to extend the accessible wavelength range by adding a small fraction of N to the composition of the InGaAsN layer. There is also a gain in stability of high-temperature performance and the dynamic performance.

Preferably, the concentration z can be between 0.005 and 0.02 when the layer has quantum wells, and between 0.005 and 0.01 when the layer is massive.

The concentration x can be between 0.5 and 0.75; the composition can in addition comprise a phosphorus concentration p and the concentration y is then roughly equal to 1−z−p. The composition of the active layer can then be denoted $In_{1-x}Ga_xAs_yN_zP_p$ in conventional notation if the active layer does not comprise additional alloy components.

Addition of phosphorus is optional and it can serve as an element of fine adjustment (compromise between the tensile stress and the desired operating wavelength) especially for applications requiring precise control of the stress, for example semiconductor optical amplifiers.

Advantageously, when the said device is a laser, the composition can be adjusted so that the active layer has a tensile stress roughly between 1% and 2.2%.

This range of tensile stress is ideal for increasing the thermal performance of the laser.

Moreover, it makes it possible to favour or even benefit from a mode of emission that is purely transverse-magnetic TM.

According to an advantageous feature, the composition can be adjusted so that the active layer has an energy difference between the centre of the heavy-hole band and the centre of the light-hole band greater than or equal to 40 meV and preferably to 50 meV.

This gives better protection against thermal agitation, by limiting the population of the first level of heavy holes, and makes it possible to stabilize a purely TM emission mode. We thus eliminate the risk of TE-TM mixing and its adverse effect on performance.

The device according to the invention can be a semiconductor amplifier in which case the composition of the active layer is adjusted so that the active layer has a tensile stress roughly shifted by 0.15% relative to the state of this layer corresponding to crossing of the centre of the heavy-hole band and of the centre of the light-hole band.

When this layer is massive, crossing is effected at zero stress, and when the layer has quantum wells, crossing is effected in a state of tension.

In one embodiment of the invention, when the said active layer has quantum wells the thickness of the active layer is less than the critical thickness.

The critical thickness is defined as the thickness starting from which the layer reaches the limit of elastic relaxation: crystallographic quality is no longer assured locally (dislocations, point defects).

The thickness of the quantum-well layer must be sufficient to be homogeneous, for example greater than 5 nm. Moreover, beyond a certain thickness, generally of the order of about 20 nm, it is difficult to obtain the desired quantum effect.

In a preferred embodiment, when the said active layer has quantum wells and is interposed between two barrier layers, these barrier layers are of a semiconductor alloy selected from an alloy based on aluminium, indium and arsenic, an alloy based on indium, arsenic and phosphorus, and an alloy based on indium, arsenic, phosphorus and gallium.

Preferably, when the said active layer has quantum wells and is interposed between two barrier layers, the said layer having a given tensile stress, the said barrier layers can be of a semiconductor material such that the latter have a compressive stress roughly equal to this tensile stress, to compensate the mechanical effects.

BRIEF DESCRIPTION OF THE DRAWINGS

The features and advantages of the invention will become clear on reading the description hereunder, based on illustrative and non-limiting examples and referring to the appended drawings in which:

FIG. 1 shows schematically a lateral sectional view of a semiconductor laser, in a preferred embodiment of the invention, FIG. 2 is a diagram with a network of curves illustrating the invention, with the degree of tensile stress of a quantum-well active layer on the abscissa and the operating wavelength on the ordinate.

DETAILED DESCRIPTION

FIG. 1 shows schematically a lateral sectional view, not to scale, of a semiconductor laser 100, in a preferred embodiment of the invention.

This semiconductor laser 100 is for example of vertical structure of the pn-BH type (BH: Buried Heterostructure) also described as being of the buried heterojunction type with p-n blocking layers.

This vertical structure comprises a substrate 1 based on n-doped indium phosphide InP covered on a bottom face 1a with a bottom metallic electrode EL1 and on the other top face 1b with a stack of semiconductor layers produced by epitaxy for example by MOVPE (metallo organic vapour phase epitaxy) or by MBE (molecular beam epitaxy) and followed if required by an etching operation.

The stack comprises in this order starting from the top face 1b:

a lower sheathing layer 2 of n-doped InP, a multilayer 3 comprising:

a quantum-well active layer 32 of $In_{1-x}Ga_xAs_yN_zP_p$ with $x \geq 0.48$, $y \leq 1-z-p$, $z \leq 0.05$, $p \geq 0$, with thickness preferably less than the critical thickness, having a tensile stress preferably roughly between 1% and 2.2%, and preferably with $Elh-Ehh \geq 50$ meV, two barrier layers 31, 33 on either side of the active layer 32, of an alloy based on $Al_xIn_{1-x}As$, $In_xGa_{1-x}As_yP_{1-y}$, for example and which preferably have a compressive stress roughly equal to the tensile stress, an upper sheathing layer 4 of p-doped InP, these latter three layers forming a ridge waveguide WG comprising on either side a first blocking layer 5 of p-doped InP which is covered by a second blocking layer 5' of n-doped InP, another layer 6 of p-doped InP, a contact layer 7 of p+ doped InGaAs, and an upper metallic electrode EL2.

The said laser 100 is for example a high-temperature continuous laser that is able to operate in the C band or in the L band.

In one variant, the active layer 3 can comprise a plurality of identical quantum-well layers.

Six examples of active layers comprising a quantum-well layer between two barrier layers for an integrated or continuous modulation laser are given below.

EXAMPLE 1

The quantum-well layer is of $In_{0.4}Ga_{0.6}As_{0.995}N_{0.005}$ with thickness chosen to be 14 nm for example. The operating wavelength is 1.55 μm. The quantum-well layer has a tensile stress of about 1%.

In the example the barrier layers are of $Al_{0.31}In_{0.69}As$ and of thickness equal to about 10 nm.

EXAMPLE 2

The quantum-well layer is of $In_{0.38}Ga_{0.62}As_{0.99}N_{0.01}$ with thickness chosen to be 10 nm for example. The operating wavelength is 1.55 μm. The quantum-well layer has a tensile stress of about 1.25%.

In the example the barrier layers are of $Al_{0.31}In_{0.69}As$ and of thickness equal to about 10 nm.

EXAMPLE 3

The quantum-well layer is of $In_{0.4}Ga_{0.6}As_{0.99}N_{0.01}$ with thickness chosen to be 14 nm for example. The operating wavelength is 1.60 μm. The quantum-well layer has a tensile stress of about 1.1%.

In the example the barrier layers are of $Al_{0.3}In_{0.69}As$ and of thickness equal to about 10 nm.

EXAMPLE 4

The quantum-well layer is of $In_{0.35}Ga_{0.65}As_{0.99}N_{0.01}$ with thickness chosen to be 12 nm for example. The operating wavelength is 1.56 μm. The quantum-well layer has a tensile stress of about 1.5%.

EXAMPLE 5

The quantum-well layer is of $In_{0.25}Ga_{0.75}As_{0.985}N_{0.015}$ with thickness chosen to be 10 nm for example. The operating wavelength is 1.55 μm. The quantum-well layer has a tensile stress of about 2.2%.

In the example the barrier layers are of $Al_{0.3}In_{0.69}As$ and of thickness equal to about 10 nm.

EXAMPLE 6

The quantum-well layer is of $In_{0.4}Ga_{0.6}As_{0.985}N_{0.015}$ with thickness chosen to be 12 nm for example. The operating wavelength is 1.63 μm. The quantum-well layer has a tensile stress of about 1.2%.

In the example the barrier layers are of $Al_{0.31}In_{0.69}As$ and of thickness equal to about 10 nm.

These examples 1 to 6 illustrate the rules of design of the active structures of quantum-well lasers in tension emitting at 1.55 μm and beyond. Apart from the fact that the high concentration of gallium and the addition of a small proportion of nitrogen are only of a nature such as to obtain emission in frequency bands that can be used for optical fibre telecommunications, these lasers display prospects of quite appreciable improvement of their optoelectronic and thermal characteristics.

$T_0$ and $T_1$ will increase significantly and will respectively reach values greater than or equal to 70° K. and greater than or equal to 150° K. The differential gain will increase by at least 30%.

The invention proposes a wide choice of composition for the active layer for example with quantum wells. In this configuration, the barrier layers are selected and the thickness and concentrations of gallium and nitrogen are adjusted until the desired wavelength is obtained preferably in the tension range between 1 and 2.2%.

The invention makes it possible moreover to produce an SOA operating at the top of the C band or in the L band, which has not been accomplished to date.

The device shown in FIG. 1 is suitable for an SOA with the exception of the differences that the active layer can be of massive material and then of thickness between 50 nm and 150 nm and that the composition is adjusted as indicated hereunder.

An SOA is constructed preferentially with gain equalized between TM and TE modes. To equalize the overall gain on these two polarizations, it is necessary to compensate the difference in optical confinement in a waveguide between the TE and TM mode by means of an active layer giving a gain TM greater than TE, which is made possible with the active layer in tension according to the invention.

When the objective is to achieve $g_{TM} \times \Gamma_{TM} = g_{TE} \times \Gamma_{TE}$ where $\Gamma$ corresponds to the wave confinement factor in the active layer, a composition is selected with a tensile stress value lower than in the case of a laser.

In SOAs with a "massive" active layer, the experimental data show that TE-TM equalization is obtained with a tensile stress of the order of 0.15%. In the case of quantum-well active layers, this same difference must be respected, to a first approximation, relative to the state of an active layer corresponding to crossing of the centre of the heavy-hole band and of the centre of the light-hole band.

Two examples of compositions of active layers for SOAs, one with a quantum well and the other massive, are given below.

EXAMPLE 7

The quantum-well layer is of $In_{0.48}Ga_{0.52}As_{0.99}N_{0.01}$ with thickness chosen to be 14 nm for example. The operating wavelength (maximum of the peak gain) is 1.64 μm. The quantum-well layer has a tensile stress of about 0.5%.

In the example the barrier layers are of $Al_{0.31}In_{0.69}As$ and of thickness equal to about 10 nm.

EXAMPLE 8

The massive layer is of $In_{0.51}Ga_{0.49}As_{0.99}N_{0.01}$ with thickness chosen to be 50 nm for example. The operating wavelength is 1.65 μm and makes it possible to cover the whole of the L band without any compromise on the performance with respect to gain. The quantum-well layer has a tensile stress of about 0.35%.

FIG. 2 is a diagram illustrating the invention, with, on the abscissa, the degree of tensile stress (Δa/a in %) of a quantum-well active layer of $In_{1-x}Ga_xAs_{0.99}N_{0.01}$ and, on the ordinate, the operating wavelength (λ in μm).

This diagram shows a group of six parallel curves 10 to 60 which will be called characteristic curves and which are associated with a quantum-well active layer for a laser or for an SOA.

Each characteristic curve 10 to 60 shows, for a given thickness equal to 8, 10, 12, 14, 16, 18 nm respectively, the variation of the operating wavelength as a function of the tensile stresses and more precisely as a function of the gallium concentration x' of the quantum-well active layer.

Increase in the concentration x' is reflected in an increase in the degree of stress.

In this example, the barrier layers are of $Al_{0.31}In_{0.69}As$ and are of thickness equal to about 10 nm.

A first curve A indicates the boundary, starting from which, on moving from left to right, the state of transverse-electric (TE) polarization of the emitted wave is less favoured or even cancelled relative to the state of transverse-magnetic (TM) polarization.

More precisely, this curve A corresponds to crossing between the light-hole and heavy-hole bands in the case of a quantum-well layer.

In the case of a laser, the respective occupancy of the heavy-hole and light-hole bands as well as the modal filtering connected with the asymmetry of the waveguide tend to reduce the beating between modes TE and TM coming respectively from the two heavy-hole and light-hole bands.

This first curve A thus crosses the characteristic curves 10 to 60 at a set of points of intersection A1 to A6 which define values of concentration x preferably corresponding to lower limits of concentration. Thus, as an example x'=0.53 for A1, x'=0.51 for A3 and x'=0.49 for A6.

A second curve B indicates the boundary starting from which a quantum-well layer displays an energy difference between the centre of the heavy-hole band and the centre of the light-hole band of the order of 50 meV (right side of curve B) or of the order of 2 kT.

More precisely, this difference and modal filtering make it possible to obtain a purely TM mode for the lasers.

This second curve B thus crosses the characteristic curves 10 to 60 at a set of points of intersection B1 to B6 that define values of concentration x'.

Thus, as an example, x'=0.635 for B1 and x'=0.61 for B3.

The first and second curves A and B are obtained from a mathematical model of band structures described in "Theoretical threshold lowering of compressively strained InGaAs/InGaAsP and GaInAsP/GaInAsP quantum-well lasers", J. Barrau et al., Electronics Letters 12th Mar. 1992 Vol. 28 No. 6 p. 551–553.

As the state of the art does not allow the case of InGaAsN alloys to be taken into account in the model, the diagram in FIG. 2 was obtained by shifting the results of a calculation for a well in InGaAs and a barrier in InAlAs by an amount equal to the shift in stress and in wavelength observed experimentally for samples in which the well is of InGaAsN.

In the case of FIG. 2, the concentration of N is 0.01. Of course, the data in FIG. 2 are indicative.

A third curve C indicates the boundary starting from which the said layer will become of poor quality (right side of curve C).

This third curve C thus crosses the characteristic curves 20 to 60 associated with the five largest thicknesses at a set of points of intersection C2 to C6 that define values of concentration x' that preferably correspond to upper limit values of concentration for quantum-well layers.

As an example, x'=0.73 for C3, x'=0.70 for C4 and x'=0.65 for C6.

The critical thickness of a quantum-well layer depends on the stress level (difference in lattice parameter) and on the thickness of the layer in question. Curve C shows the limit calculated in the Matthews-Blakeslee model: J. W. Matthews and A. E. Blakeslee, J. Crystal Growth 27, 118 (1974); 29, 273 (1975); 32, 265 (1976).

Note that the experimental limit may differ from this calculated limit and the known applications demonstrate that the limiting threshold is generally pushed back towards higher stress levels in the case of quantum-well structures and barriers with partially or fully compensated stress.

Thus, the concentration x is preferably between 0.5 and 0.75.

The compositions in the aforementioned examples 2, 3 and 4 for a laser are shown on the characteristic curves 20, 40, 30 respectively and correspond to the points designated E2, E3, E4 respectively.

For a given thickness, and in this example, for optimized thermal performance of lasers, the following corresponding range of compositions will be preferred:

at 8 nm the range of composition to the right of curve B,
between 10 nm and 14 nm the segments B2C2, B3C3, B4C4,
at 16 or 18 nm, the points to the left of curve C.

Moreover, compositions on the right side of straight line D with the equation Da/a=1% are preferably chosen.

The composition of example 8 for SOA is shown on characteristic curve 40 and corresponds to the point designated E8.

For an SOA the composition of the active layer for example with quantum wells is preferably located on one of the segments AiBi or A6C6 at 18 nm in FIG. 2, according to the required wavelength domain.

Naturally, the choice of compositions becomes narrower with increase in thickness and towards long wavelengths.

In general, for a quantum-well layer, it is possible to cover a range of wavelengths for example greater than or equal to 1.55 µm:

by increasing the thickness of the quantum well at constant nitrogen concentration,
by increasing the nitrogen concentration at constant thickness of quantum well.

For a composition with a certain concentration of gallium, a nitrogen concentration of 0.01 produces a shift of about 0.1 µm in wavelength relative to the same composition without nitrogen as well as an increase in tensile stress of 0.2%.

Similarly, for a composition with a certain concentration of gallium, a nitrogen concentration of 0.02 produces a shift of about 0.2 µm in wavelength relative to the same composition without nitrogen as well as an increase in tensile stress of 0.4%.

In summary, the invention provides a semiconductor optical device (100) such as a laser or semiconductor optical amplifier (SOA) based on an indium phosphide substrate (1) or equivalent buffer layer. The active layer (32) of the device is based on conventional InGaAs(P) alloy, but additionally includes N in order to increase the operating wavelength to greater than 1.5 µm, preferably to a wavelength lying in the C- or L-band. The active layer composition may thus be denoted $In_{1-x}Ga_xAs_yN_zP_p$ with $x \geq 0.48$, $y \leq 1-z-p$, $z \leq 0.05$, $p \geq 0$. The active layer may include a quantum well or multi-quantum wells in which case its thickness is preferably less than the critical thickness for lattice relaxation. In other embodiments the active layer is a "massive" layer with quasi-bulk properties. The active layer may advantageously be under tensile stress, preferably roughly between 1% and 2.2%, to manipulate the light and heavy hole bands. The active layer is typically bounded by barrier layers (31, 33) made of a suitable semiconductor alloy, such as AlInAs or InGaAs(P).

The invention claimed is:
1. A semiconductor optical device comprising:
a substrate based on indium phosphide, and an active layer having a composition adjusted for an operating wavelength greater than 1.55 μm that comprises:
  a gallium concentration x greater than or equal to 0.48;
  an indium concentration 1−x;
  a phosphorus concentration p;
  a nitrogen concentration z less than or equal to 0.05; and
  an arsenic concentration y, where y is roughly equal to 1−z−p.

2. The semiconductor optical device according to claim 1, wherein the active layer has a quantum well and the nitrogen concentration z is between 0.005 and 0.02.

3. The semiconductor optical device according to claim 1, wherein the active layer is massive and the nitrogen concentration z is between 0.005 and 0.01.

4. The semiconductor optical device according to claim 1, wherein the gallium concentration x is between 0.5 and 0.75.

5. The semiconductor optical device according to claim 1, wherein the device is a laser and the composition is such that the active layer has a tensile stress roughly between 1% and 2.2%.

6. The semiconductor optical device according to claim 1, wherein the device is a laser and the composition is such that the active layer has an energy difference between the centre of the heavy-hole band and the centre of the light-hole band greater than or equal to 40 meV.

7. The semiconductor optical device according to claim 1, wherein the device is a laser and the composition is such that the active layer has an energy difference between the centre of the heavy-hole band and the centre of the light-hole band greater than or equal to 50 meV.

8. The semiconductor optical device according to claim 1, wherein the device is a semiconductor amplifier and the composition is such that the active layer has a tensile stress roughly shifted by 0.15% relative to the state of the active layer corresponding to crossing of the centre of the heavy-hole band and the centre of the light-hole band.

9. The semiconductor optical device according to claim 1, wherein the active layer has a quantum well, with the thickness of the active layer being less than a critical thickness.

10. The semiconductor optical device according to claim 1, wherein the active layer is of the quantum-well type and is interposed between two barrier layers, the two barrier layers being of a semiconductor alloy based on aluminum, indium and arsenic (AlInAs).

11. The semiconductor optical device according to claim 1, wherein the active layer is of the quantum-well type and is interposed between two barrier layers, the two barrier layers being of a semiconductor alloy based on indium, arsenic and phosphorus (InAsP).

12. The semiconductor optical device according to claim 1, wherein the active layer is of the quantum-well type and is interposed between two barrier layers, the two barrier layers being of a semiconductor alloy based on indium, gallium, arsenic and phosphorus (InGaAsP).

13. The semiconductor optical device according to claim 1, wherein the active layer is of the quantum-well type and is interposed between two hater layers and the quantum-well layer has a given tensile stress, the said barrier layers being of a semiconductor material such that the barrier layers have a compressive stress roughly equal to the tensile stress.

14. The semiconductor optical device according to claim 1, wherein the operating wavelength is greater or equal to 1.60 μm.

15. The semiconductor device according to claim 14, wherein the gallium concentration x is between 0.48 and 0.75.

16. The semiconductor device according to claim 14, wherein the gallium concentration x is 0.60 and the nitrogen concentration z is 0.01.

17. The semiconductor device according to claim 14, wherein the active layer is disposed between two hater layers which have a compressive stress roughly equal to a tensile stress.

18. A semiconductor optical device comprising:
a substrate based on indium phosphide, and
an active layer having a composition adjusted for an operating wavelength of at least 1.60 μm that comprises:
  a gallium concentration x greater than or equal to 0.48;
  an indium concentration 1−x;
  a nitrogen concentration z less than or equal to 0.05; and
  an arsenic concentration y, where y is roughly equal to 1−z.

19. A semiconductor optical device comprising:
a substrate based on indium phosphide, and
an active layer having a composition adjusted for an operating wavelength greater than 1.60 μm that comprises:
  a gallium concentration x greater than or equal to 0.48;
  an indium concentration 1−x;
  a nitrogen concentration z less than or equal to 0.05; and
  an arsenic concentration y, where y is roughly equal to 1−z, wherein the composition can be adjusted so that the active layer has an energy difference between the centre of the heavy-hole band and the centre of the light-hole band greater than or equal to 40 meV and preferably to 50 meV.

* * * * *